United States Patent [19]

Jones et al.

[11] Patent Number: 5,057,351

[45] Date of Patent: Oct. 15, 1991

[54] METALLIZED POLYETHYLENE PLEXIFILAMENTARY FILM-FIBRIL SHEET

[75] Inventors: David C. Jones, Midlothian; Chi-Chang Lee, Richmond, all of Va.

[73] Assignee: E. I. du Pont de Nemours and Company, Wilmington, Del.

[21] Appl. No.: 610,760

[22] Filed: Nov. 8, 1990

Related U.S. Application Data

[62] Division of Ser. No. 377,682, Jul. 10, 1989, Pat. No. 4,999,222.

[51] Int. Cl.$^5$ .............................................. B32B 3/10
[52] U.S. Cl. .................................. 428/138; 428/134; 428/137; 428/457; 428/938
[58] Field of Search ............. 428/938, 225, 263, 285, 428/457, 221, 131, 134, 136, 137, 138

[56] References Cited

U.S. PATENT DOCUMENTS

| | | | |
|---|---|---|---|
| 3,081,519 | 3/1963 | Blades et al. | 28/81 |
| 3,169,899 | 2/1965 | Steuber | 161/72 |
| 3,227,794 | 1/1966 | Anderson et al. | 264/205 |
| 3,442,740 | 5/1969 | David | 156/181 |
| 3,532,589 | 10/1970 | David | 161/150 |
| 4,508,776 | 4/1985 | Smith | 428/248 |
| 4,974,382 | 12/1990 | Avellanet | 52/408 |

OTHER PUBLICATIONS

Product Licensing Index, Research Disclosure, "Tyvek Air Infiltration Barrier in Housing Construction", p. 556 (10/79).

Primary Examiner—James J. Bell

[57] ABSTRACT

A metallized high specular gloss polyethylene emissivity is made by a proceess of calendering a polyethylene film-fibril sheet between a smooth metal roll and a soft, resilient roll to form a sheet of high specular gloss, followed by vacuum metallization of the smooth high specular gloss surface. Such metallized sheets are useful as radiant barriers or roof liners for energy savings purposes.

3 Claims, No Drawings

METALLIZED POLYETHYLENE PLEXIFILAMENTARY FILM-FIBRIL SHEET

This is a division of application Ser. No. 07/377,682, filed July 10, 1989 now U.S. Pat. No. 4,999,22.

BACKGROUND OF THE INVENTION

1. Field of the Invention

This invention relates to a metallized high specular gloss polyethylene plexifilamentary film-fibril sheet with low emissivity, high moisture vapor permeability and good resistance to air and water penetration, and a process to prepare the high specular gloss and metallized sheets.

2. Description of the Prior Art

Materials with low emissivities have been used as thermal barriers to reduce the amount of heat transfer by radiation in many areas of construction. The lower the emissivity value, the better the barrier by virtue of reflecting infrared radiation. Specifically, a blackbody reference, of emissivity equal to 1, is capable of absorbing all radiant energy. A non-transmitting barrier with an emissivity of 0.1, for example, means that 10 percent of the radiant energy directed at it is absorbed and only that amount can be emitted to its surroundings. That is because, by definition, 90 percent of the radiant energy is reflected away.

In the past, bright aluminum foils or metallized films have been the most effective products due to their low emissivities and ease of installation. Low emissivity materials are typically referred to as "Radiant Barriers". Installation of radiant barriers in residential dwellings is usually in one of three locations in the attic space; (1) on the attic floor above the insulation installed over the floor joists, (2) under the roof rafters, or (3) draped under the roof deck. Other installation locations exist in vaulted ceiling arrangements and behind vertical knee walls.

In some installation locations, the radiant barrier may serve a dual energy saving function. That is, reducing the radiation heat transfer from the roof in the summer months and reducing convective heat losses in the winter months by restricting air exchange in and around installed insulation However, in dwellings and other buildings, moisture migrates from the living space, creating a requirement for the radiant barrier to be able to transmit moisture. Aluminum foils and metallized films inherently are vapor barriers and are unsuitable for these locations. To overcome this moisture barrier problem in the radiant barriers of the prior art, perforations have been made in these products to increase their ability to transmit moisture. This is done at the expense of increasing the emissivity and reducing effectiveness as an air barrier.

Nonwoven sheets made from polyethylene film-fibrils have been known to provide a combination of high moisture vapor permeability and good resistance to air penetration. They have been used in this capacity as an air infiltration barrier housewrap product. Product Licensing Index, Research Disclosure, "Tyvek Air Infiltration Barrier In Housing Construction," p. 556 (Oct., 1979). This type of nonwoven sheet has a high emissivity, generally about 0.55, and is not suitable as a radiant barrier. Polyethylene plexifilamentary film-fibril sheets such as "Tyvek" (Registered Trademark of E. I. du Pont de Nemours & Co. Inc., Wilmington, Del.) Types 10, 1621C and 1622 which have been metallized are commercially available. Such metallized sheets have, for example, been used for screening commercial glass-houses as disclosed in U.S. Pat. No. 4,508,776. These metallized polyethylene sheets of the prior art have high emissivities, on the order of 0.2 to 0.32, and are generally unsuitable for use as radiant barriers.

SUMMARY OF THE INVENTION

There is provided by this invention a high gloss polyethylene plexifilamentary film-fibril sheet having a specular gloss on at least one side of at least 28 percent, a moisture vapor transport of at least 250 g/m$^2$/24 hours, a Gurley Hill porosity of at least 30 seconds and a hydrostatic head of at least 55 inches.

Also provided by this invention is a process for preparing a high gloss polyethylene plexifilamentary film-fibril sheet comprising:

(a) hot calendering a polyethylene plexifilamentary film-fibril sheet to a specular gloss on at least one side of at least 28 percent by passing the sheet through a nip, with a pressure of at least 18 kilograms per centimeter, where in a first roll in the nip is a metal roll with a surface smoothness of no greater than 5 rms micro-inch and is maintained at a temperature sufficient to heat a surface of the sheet to between 0° to 8° C. below the melting point of the polyethylene sheet and a second roll in the nip has a 70 Shore A durometer hardness or less.

Also provided by this invention is metallized polyethylene plexifilamentary film-fibril sheet having an emissivity on at least one side of from 0.06 to 0.18, a moisture vapor transport of at least 250 g/m$^2$/24 hours, a Gurley Hill porosity of at least 30 seconds and a hydrostatic head of at least 55 inches.

Also provided by this invention is a process for preparing a metallized polyethylene plexifilamentary film-fibril sheet having an emissivity on at least one side of from 0.06 to 0.18 comprising:

(a) hot calendering a polyethylene plexifilamentary film-fibril sheet to a specular gloss on at least one side of at least 28 percent by passing the sheet through a nip, with a pressure of at least 18 kilograms per centimeter, wherein a first roll in the nip is a metal roll with a surface smoothness of no greater than 5 rms micro-inch and is maintained at a temperature sufficient to heat a surface of the sheet to between 0° to 8° C. below the melting point of the polyethylene sheet and a second roll in the nip has a 70 Shore A durometer hardness or less;

(b) vapor depositing a metal on the calendered side of the sheet.

DETAILED DESCRIPTION OF THE INVENTION

The starting material for the substrate sheet of the present invention is a lightly consolidated flash-spun polyethylene plexifilamentary film-fibril sheet produced by the general procedure of Steuber, U.S. Pat. No. 3,169,899. According to a preferred method for making the starting sheets, a linear polyethylene having a density of 0.96 g/cm$^3$, a melt index of 0.9 (determined by ASTM method D-1238-57T, condition E) and a 135° C. upper limit of its melting temperature range is flash spun from a 12 weight percent solution of the polyethylene in trichlorofluoromethane. The solution is continuously pumped to spinneret assemblies at a temperature of about 179° C. and a pressure above about 85 atmospheres. The solution is passed in each spinneret assembly through a first orifice to a pressure let-down zone and then through a second orifice into the surrounding atmosphere. The resulting film fibril strand is spread and oscillated by means of a shaped rotating baffle, is electrostatically charged and then is deposited on a moving belt. The spinnerets are spaced to provide overlapping, intersecting deposits on the belt to form a wide batt. The batt is then lightly consolidated by passage through a nip that applies a load of about 1.8 kilograms per cm of batt width. Generally, the thusly formed lightly consolidated sheet having a unit weight in the range of 25 to 50 grams per square meter is suitable for use in the process of the present invention.

The term "plexifilamentary" as used herein, refers to a strand which is characterized as a three-dimensional integral network of a multitude of thin, ribbon-like, film-fibril elements of random length and of less than about 4 microns average thickness, generally coextensively aligned with the longitudinal axis of the strand. The film-fibril elements intermittently unite and separate at irregular intervals in various places throughout the length, width and thickness of the strand to form the three-dimensional network. Such strands are described in further detail by Blades and White, U.S. Pat. No. 3,081,519 and by Anderson and Romano, U.S. Pat. No. 3,227,794.

The lightly consolidated sheet is preferably bonded on at least one side. The term "bond" as used herein, refers to bonding according to the general procedure of David, U.S. Pat. No. 3,442,740 before the hot calendering process of this invention U.S. Pat. No. 3,442,740 is incorporated by reference.

In David U.S. Pat. No. 3,442,740, the lightly consolidated sheet, prepared as described above, is subjected in a heating zone to light compression between two surfaces to prevent shrinkage. The first surface is a hard, heat-conducting material and is maintained throughout the treatment at a temperature substantially equal to or greater than the upper limit of the melting range of the polyethylene. The second surface, a flexible poor heat conductor, is not heated. The polyethylene sheet is exposed long enough to allow the face exposed to the heated surface to reach a temperature within 7° C. of the upper limit of the melting range of the polyethylene but not substantially above the upper limit, and to allow the second face of the sheet to reach a temperature 0.8° to 10° C. lower than the first face of the sheet. The temperature to which the face of the sheet is heated is controlled by the process parameters of the heated roll, sheet speed and sheet thickness. The estimate of the temperature of the surface of the sheet is confirmed by acceptable abrasion resistance of the sheet surface. If the temperature is too high, the surface of the sheet partially melts and becomes film-like. If too low, the abrasion resistance is inadequate. Abrasion resistance can be measured quantitatively by a Crockmeter tester, as described in David, U.S. Pat. No. 3,532,589 col. 9, line 4, which patent is incorporated by reference. Finally, the sheet is directly passed, while under light restraining compression, through a cooling zone wherein the temperature of the sheet throughout its thickness is reduced to a temperature less than that at which the sheet distorts o: shrinks when unrestrained.

The lightly consolidated sheet, or preferably a bonded sheet prepared as described above, is then hot calendered on at least one side. The hot calendering process of the present invention yields the high specular gloss sheet of this invention. The lightly consolidated sheet or the sheet bonded as described above, is hot calendered on a side by exposing the sheet to heat and pressure in a nip, using a pair of rolls of specific construction. One roll is metal having a surface finish of no greater than 5 rms micro-inch and preferably no greater than 2 rms micro-inch. The term "rms" as used herein, refers to the root mean square value above and below the mean surface and is obtained by taking the square root of the average square. The average square is simply the sum of squares of the individual values of the distance from the peaks and valleys to the mean surface divided by the total number of peaks and valleys on the roll surface. A value of 5 rms micro-inches or less generally requires the the roll surface be lapped, polished or superfinished. The second opposing roll comprises a roll of 70 shore A durometer hardness or less, such as a resilient elastomer covered metal roll. The metal roll is maintained at a temperature sufficient to heat a surface of the sheet to between 0° to 8° C., preferably 0° to 2° C., of the polyethylene sheet melting temperature. Finally the sheet is cooled before metallization.

In operation, the steam temperature in the heated metal roll is usually between about 150° and 185° C. Speeds of 30 to 100 meters per minute may conveniently be used. The pressure between the two rolls during operation is generally at least 18 kilograms per centimeter and usually from 18 to 40 kilograms per cm depending on temperature of the metal roll, the hardness of the second roll and line speed. Practice of this invention requires a reasonable combination of metal roll temperature, line speed, nip pressure and hardness of the second roll.

The polyethylene plexifilamentary sheet is calendered as described above so that at least one face has a Technidyne T-480 Glossmeter (75 degrees) specular gloss reading of at least 28 percent. Readings of at least 28 percent on the face of the substrate sheet to be metallized, are necessary to produce the low emissivity of the metallized polyethylene plexifilamentary film-fibril sheet of the invention.

The sheet, calendered as described above, can then be metallized on at least one side, a calendered side, for use as a radiant barrier. Vacuum metallizing is a well known process in which metals are vaporized by heat and vacuum, and are then deposited on the surface of a solid article. From a cost/performance standpoint, aluminum is the preferred metal. Generally, a typical metallization process takes place in an evacuated chamber at an absolute pressure of 0.005 to 0.010 millimeters Hg. The sheet passes over a number of crucibles containing molten aluminum. Typical process speeds are 450 to 700 feet/min. Lower metallization speeds tend to correlate with lower emissivities but increased residence time in the chamber can damage the sheet. The thickness of the deposited aluminum depends on the pressure inside the chamber, temperature of the molten aluminum, and surface speed of the sheet. A cooled chill roll is used to back up the sheet and prevent damage from the high temperatures reached during metallization. The sheet is generally metallized to a metal thickness of between 75 to 300 Angstroms.

The metallized sheet of this invention is made from a substrate sheet having, as mentioned previously, high specular gloss on at least one side. In order to achieve the desired emissivity and air and vapor permeability, the characteristics of the substrate sheet must be carefully controlled.

The high specular gloss polyethylene plexifilamentary film-fibril sheet of this invention has a specular gloss on at least one side of at least 28 percent, a moisture vapor transport of at least 250 g/m²/24 hours, a Gurley Hill porosity of at least 30 seconds and a hydrostatic head of at least 55 inches.

The substrate sheet can be metallized, and the metallized polyethylene plexifilamentary film-fibril sheet of this invention has an emissivity on at least one side of from 0.06 to 0.18, a moisture vapor transport of at least 250 g/m²/24 hours, a Gurley Hill porosity of at least 30 seconds and a hydrostatic head of at least 55 inches. That is, the metallized sheet has an emissivity on the metallized side of from 0.06 to 0.18, and air and vapor permeability approximately the same as for the substrate high specular gloss sheet.

TEST METHODS

The various sheet characteristics referred to in the Examples below are measured by the following methods. In the test method descriptions "TAPPI" refers to the Technical Association of Pulp and Paper Industry. "ASTM" refers to the American Society of Testing Materials and "AATCC" refers to the American Association of Textile Chemists and Colorists.

Basis Weight is measured in accordance with either TAPPI T-410 OS-61 or by ASTM D3376-79 and is reported herein as g/m².

Specular Gloss is measured using a Technidyne Model T-480 Glossmeter which conforms to the testing requirements of TAPPI T-480. The instrument measures the amount of reflected light off the surface of the sample at an angle of incidence of 75° and the value is expressed in percent. The instrument is available from Technidyne Corporation, 100 Quality Ave., New Albany, Ind. 471550.

Emissivity is measured using an Emissometer model AE according to manufacturer's procedure. The device is sold by Devices and Services Instruments, Dallas, Tex.

Moisture Vapor Transmission Rate is measured in accordance with ASTM E-96 condition B and is expressed in grams per square meter per 24 hours. This test measures the ability of a sheet product to pass moisture vapor over a fixed time period under fixed environmental conditions.

Gurley Hill Porosity is measured in accordance with TAPPI T-460 using a Lorentzen & Wettre Model 121D Densometer. This test measures the speed at which 100 cubic centimeters of air is pushed through a one inch diameter sample under a pressure of approximately 4.9 inches of water. The result is expressed in seconds and is usually referred to as Gurley Seconds. In essence, this test demonstrates the degree of air penetration resistance at a fixed pressure.

Hydrostatic Head is measured in accordance with AATCC 127-1980 using an Alfred Suter Company Tester Type 502. This test measures the amount of water that can be suspended above a sample without penetration through the sample in the form of water droplets. The results are expressed in inches of water.

EXAMPLES

In each of the examples described below, the starting material was a lightly consolidated sheet of flash-spun polyethylene plexifilamentary film-fibril strands prepared as described by the general method of Steuber, U.S. Pat. No. 3,169,899 and bonded by the general methods of David, U.S. Pat. No. 3,442,740. (Such sheets are sold commercially as "Tyvek" type 1050B). The polyethylene film-fibril sheet had a basis weight of 47.6 g/m².

EXAMPLE A

In this control, tests were conducted on a commercially available sheet of "Tyvek" type 1050B. Details of the tests and characteristics of the product on the basis of 5 to 12 samples are given in Table I.

TABLE I

| | Mean | Standard Deviation | High | Low |
|---|---|---|---|---|
| Specular Gloss % (Smoother Face) | 11.4 | 0.6 | 12.3 | 10.5 |
| Moisture Vapor Transmission Rate g/m²/24 hours | 678 | 28 | 720 | 635 |
| Gurley Hill Porosity seconds | 14 | 4 | 26 | 10 |
| Hydrostatic Head inches | 56 | 4 | 61 | 49 |

EXAMPLE 1

In this example, "Tyvek" type 1050B was hot calendered on one side in accordance with the invention. In the hot calendering process, the sheet was passed through a nip with the smoother surface, i.e. the final bonded surface, of the sheet in contact with the heated metal roll. The nip was loaded to a pressure of 38 kg/cm and was operated at a line speed of 30 meters per minute. The metal roll was heated to 152° C. so that the sheet surface in contact with the roll was heated to within 5° C. of the polyethylene melting point. The heated metal roll had a surface finish of 5 rms microinch. The backup second roll was covered with an elastomer of 70 Shore A durometer hardness. Both rolls were 25.4 cm in diameter. The emerging calendered sheet was cooled by an air jet to minimize puckering and edge curling from the heat. Details of the tests and characteristics of the resultant unmetallized product based on 4 to 12 samples are given in Table II.

TABLE II

| | Mean | Standard Deviation | High | Low |
|---|---|---|---|---|
| Specular Gloss % Smoother Face | 34.0 | 2.5 | 37.4 | 29.6 |
| Moisture Vapor Transmission Rate g/m²/24 hours | 711 | 72 | 784 | 597 |
| Gurley Hill Porosity seconds | 65 | 16 | 40 | 6 |
| Hydrostatic Head inches | 64 | 4 | 70 | 58 |

EXAMPLE B

In this control, the sheet of Example A was vacuum metallized on the smoother face of the sheet with aluminum at 500 feet per minute to a thickness in the range from 75 to 300 Angstroms by standard practice. Details of the tests and characteristics of the resultant product on the basis of 6 to 12 samples are given in Table III.

TABLE III

|  | Mean | Standard Deviation | High | Low |
|---|---|---|---|---|
| Emissivity (Metallized Side) | 0.28 | 0.02 | 0.32 | 0.24 |
| Moisture Vapor Transmission Rate g/m$^2$/24 hours | 910 | 81 | 1024 | 791 |
| Gurley Hill Porosity seconds | 19 | 19 | 40 | 5 |
| Hydrostatic Head inches | 51 | 5 | 50 | 42 |

EXAMPLE 2

In this example, the sheet prepared as described in Example 1, was vacuum metallized, as in Example B, on the calendered side, the side with the higher specular gloss. Details of the tests and characteristics of the resultant product based on 5 to 12 samples are given in Table IV.

TABLE IV

|  | Mean | Standard Deviation | High | Low |
|---|---|---|---|---|
| Emissivity (Metallized Side) | 0.10 | 0.01 | 0.11 | 0.09 |
| Moisture Vapor Transmission Rate g/m$^2$/24 hour | 602 | 24 | 623 | 568 |
| Gurley Hill Porosity seconds | 80 | 15 | 100 | 40 |
| Hydrostatic Head inches | 69 | 1 | 70 | 67 |

EXAMPLE 3

In this example, "Tyvek" type 1050B was hot calendered on one side in accordance with the invention on full scale commercial equipment. In the hot calendering process, the sheet was passed through a nip with the smoother surface of the sheet in contact with the heated metal roll. The nip was loaded to a pressure of 36 kg/cm and was operated at a line speed of 51 meters per minute. The metal roll was heated to 176°-178° C. so that the sheet surface was heated to within 2° C. of the polyethylene melting point. The metal roll had a surface finish of 1 rms micro-inch. The backup roll was covered with an elastomer of 55 Shore A durometer hardness. Both rolls were 25.4 cm in diameter. The emerging calendered sheet was cooled by an air jet to minimize puckering and edge curling from the heat. Details of the tests and characteristics of the resultant unmetallized product based on 48 samples and are given in Table V.

TABLE V

|  | Mean | Standard Deviation | High | Low |
|---|---|---|---|---|
| Specular Gloss % (Smoother Face) | 35.2 | 1.5 | 38.9 | 32.2 |

EXAMPLE 4

In this example, the sheet prepared as described in Example 3 was vacuum metallized on the side with the higher specular gloss as in Example B. Details of the tests and characteristics of the resultant product based on 5 to 12 samples are given in Table VI.

TABLE VI

|  | Mean | Standard Deviation | High | Low |
|---|---|---|---|---|
| Emissivity (Metallized Side) | 0.08 | 0.02 | 0.11 | 0.06 |
| Gurley Hill Porosity seconds | 170 | 39 | 209 | 127 |
| Hydrostatic Head inches | 70 | 1 | 70 | 69 |

We claim:

1. A metallized polyethylene plexifilamentary film-fibril sheet having an emissivity on at least one side of from 0.06 to 0.18, a moisture vapor transport of at least 250 g/m$^2$/24 hours, a Gurley Hill porosity of at least 30 seconds and a hydrostatic head of at least 55 inches.

2. The sheet of claim 1 wherein the sheet is metallized by vacuum deposition with aluminum.

3. The sheet of claim 2 wherein the aluminum thickness is in the range from 75 to 300 Angstroms.

* * * * *